United States Patent [19]

Hirayama

[11] Patent Number: 5,323,071
[45] Date of Patent: Jun. 21, 1994

[54] SEMICONDUCTOR INTEGRATED CIRCUIT DEVICE HAVING LOGIC LEVEL CONVERSION CIRCUIT

[75] Inventor: Hiromitsu Hirayama, Tokyo, Japan

[73] Assignee: NEC Corporation, Tokyo, Japan

[21] Appl. No.: 864,256

[22] Filed: Apr. 6, 1992

[30] Foreign Application Priority Data

Apr. 5, 1991 [JP] Japan .................. 3-072691

[51] Int. Cl.$^5$ ............... H03K 19/0175; H03K 19/094
[52] U.S. Cl. .................. 307/475; 307/448; 307/443; 307/296.8; 307/310
[58] Field of Search ........... 307/448, 475, 443, 296.8, 307/296.6, 310

[56] References Cited

U.S. PATENT DOCUMENTS

| | | | |
|---|---|---|---|
| 4,340,867 | 7/1982 | Sano | 307/448 |
| 4,645,998 | 2/1987 | Shinohara et al. | 307/296.8 |
| 4,707,622 | 11/1987 | Takao et al. | 307/475 |
| 4,752,701 | 6/1988 | Gonoi | 307/448 |
| 4,771,194 | 9/1988 | Van Zeghbroeck | 307/448 |
| 4,931,669 | 6/1990 | Highashisaka | 307/448 |
| 5,168,180 | 12/1992 | Bayer et al. | 307/296.8 |

FOREIGN PATENT DOCUMENTS

32112  2/1991  Japan .

Primary Examiner—Edward P. Westin
Assistant Examiner—Jon Santamauro
Attorney, Agent, or Firm—Sughrue, Mion, Zinn, Macpeak & Seas

[57] ABSTRACT

A semiconductor integrated circuit device has an input logic level conversion circuit which receives an external input signal and some reference voltages, an internal logic circuit connected between a first and a second power supply terminal, which receives an output voltage from the input logic level conversion circuit and outputs an output signal at an output terminal, and a standard voltage generation circuit connected between the first and second power supply terminals, which has the same circuit configuration as that of the internal logic circuit and which outputs a standard voltage whose level is identical with the threshold value of the internal logic circuit. The standard voltage is supplied to the input logic level conversion circuit as one of the reference voltages. The standard voltage generation circuit is formed by at least a driver FET, a load element and a negative feedback resistor. The level matching between the level of the external input signal and the internal logic level can be satisfactorily maintained regardless of the changes in the power supply voltages and the temperature changes.

8 Claims, 6 Drawing Sheets

SEMICONDUCTOR INTEGRATED CIRCUIT DEVICE HAVING LOGIC LEVEL CONVERSION CIRCUIT

BACKGROUND OF THE INVENTION (1) Field of the Invention

The present invention relates to a semiconductor integrated circuit device, and more particularly to a semiconductor integrated circuit device having a logic circuit using a Schottky junction type field effect transistor formed on a gallium arsenide (GaAs) substrate.

(2) Description of Related Art

In a semiconductor integrated circuit device equipped with an input circuit formed on a semiconductor substrate, which circuit has an input logic level conversion circuit using field effect transistors (hereinafter referred to as "FET"s) and diode, the matching between the levels of the external input signal and the logic levels of the internal logic circuit is achieved by making the output voltage of the input logic level conversion circuit to be always identical with the input logical threshold value of the internal logic circuit connected to the input logic level conversion circuit, whereby the stability of the circuit against fluctuations in the power source voltage and changes in temperature is achieved.

Figure 1A:
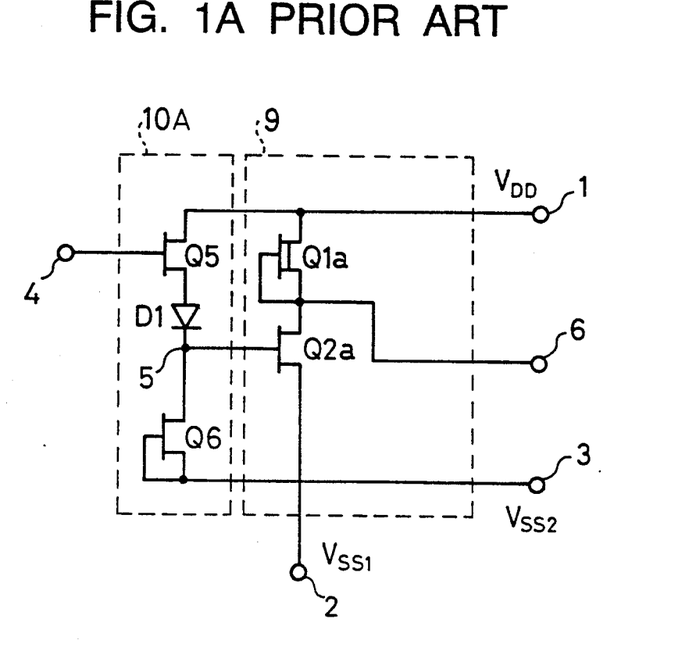
FIGS. 1A and 1B are circuit diagrams respectively showing two conventional semiconductor integrated circuits.
Figure 1B:
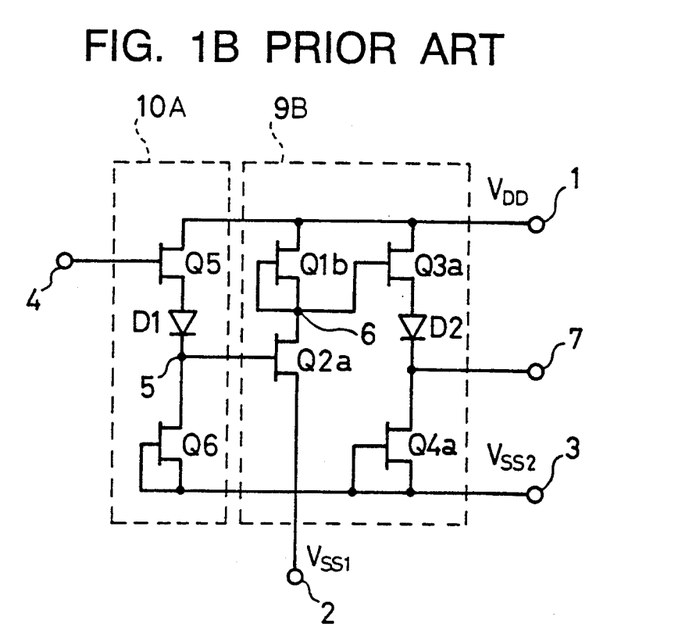

Conventionally, in the semiconductor integrated circuit device of the kind explained above (hereinafter called "GaAs IC"s), a single-ended type logic circuit is widely used because of the simplicity of its circuit configuration and its comparative ease in securing a wide circuit operation margin due to a high voltage gain. Typical circuits are shown in FIG. 1A and FIG. 1B. An internal logic circuit 9 shown in FIG. 1A is called "DCFL" (abbreviation of Direct Coupled FET Logic circuit), and consists of a load FET Q1a of a depletion mode and a driving FET Q2a of an enhancement mode. Also, an internal logic circuit 9B shown in FIG. 1B is called "BFL" (abbreviation of Buffered FET Logic circuit), and consists of a level shift diode D2 and FETs Q1b, Q2a, Q3a and Q4a, all being of a depletion mode and having the same threshold voltage.

As it is normal that the internal logic levels of the GaAs IC and the external logic levels are not identical, an input logic level conversion circuit 10A should be provided. The ECL levels are generally used for the high-speed digital signal processing system. Therefore, in the above circuits, the power supply voltage $V_{DD}$ is set at the voltage of ground potential, the first source power supply voltage $V_{SS1}$ is set at $V_{SS1}=-2$ V and the second source power supply voltage $V_{SS2}$ is set at $V_{SS2}=-5.2$ V.

The level matching between the logic levels in the internal logic circuit in the GaAs IC and the external logic levels is indispensable for realizing an ultra-high speed operation in the GaAs ICs. Especially, in the ECL levels, it is 0.7~0.8 V between the peaks of logic amplitudes. Consequently, level matching errors tolerable in the above level matching must be suppressed within a range of $\pm (100 \sim 200)$ mV. In other words, the input logic level conversion circuit must have some kind of adjusting function in order to hold the necessary logic level matching against fluctuations in the power supply voltages or changes in the device parameters due to temperature changes.

However, the input logic level conversion circuit 10A in FIGS. 1A and 1B does not have such a function, and has the problems, for instance, that the tolerable range of fluctuations in the first source power supply voltage $V_{SS1}$ is less than $\pm (100 \sim 150)$ mV, and that it is also weak against temperature changes because of the temperature dependency (about $-1$ mV/°C.) of the level shift amount $V_F$ of the level shift diode D1. Especially, in the ultra high-speed region of more than several Gbps, the maximum operation speed of the GaAs IC is determined in many cases by the properties of level matching of the input logic level conversion circuit and this was a problem. Also, in the large scale integrated circuit (LSI), generally, it is a trend to try to improve the FET performance and to decrease the logic amplitude in order to achieve low power consumption and high speed operation at the same time. In this case, the above problem of level matching becomes especially conspicuous and becomes a big barrier to the actual usage of the GaAs ICs.

On the other hand, in the BFL circuit shown in FIG. 1B, the logical threshold value of the BFL inverter is equal to the first source power supply voltage $V_{SS1}$ in the case where the gate width, the threshold voltage, etc. of the FET Q1b are the same as those of the FET Q2a. In this case, although a change in the logic threshold value due to a temperature change is eliminated, the above mentioned problem as to the level matching is not solved because of the temperature dependency of the level shift diode D1. The input logic level conversion circuit which has an adjusting function on the above temperature properties of the level shift amount $V_F$ of the level shift diode D1 and the changes in the first source power supply voltage $V_{SS1}$ is proposed in the Japanese Patent Application Kokai No. 32,112/1991 (Hei 3-32,112).

Figure 2:
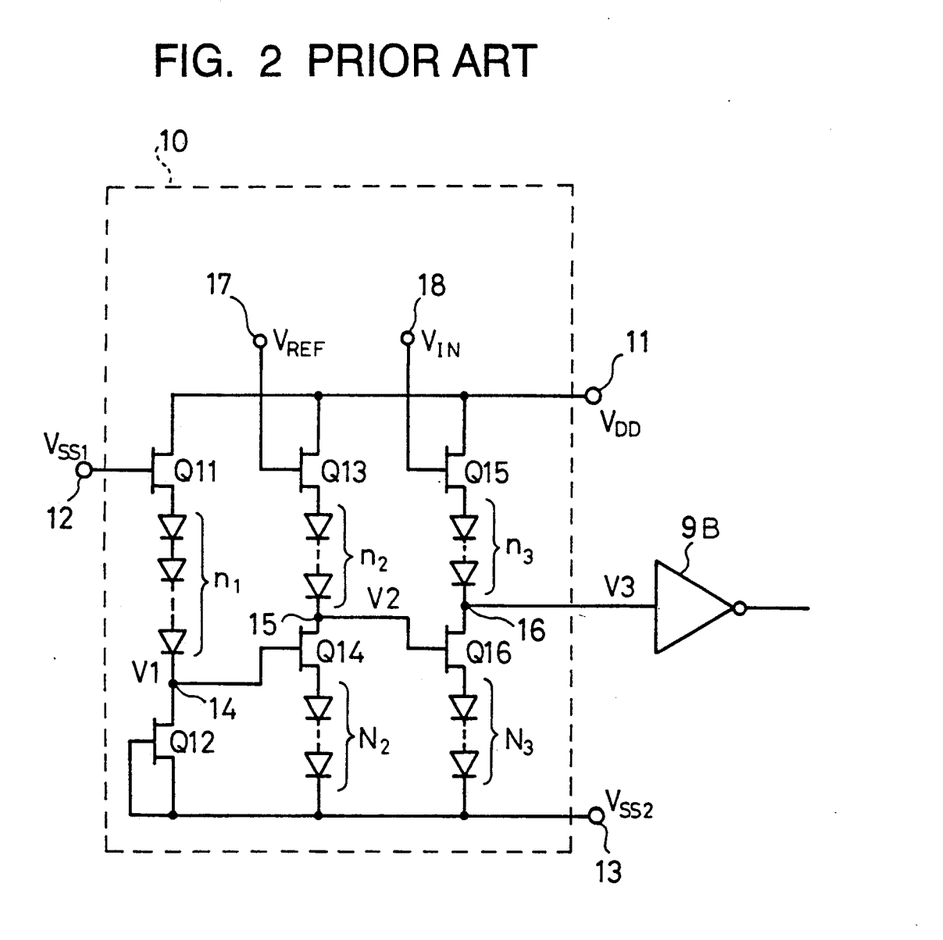
FIG. 2 is a circuit diagram showing an example of a conventional input logic level conversion circuit.

The input logic level conversion circuit mentioned above is shown in FIG. 2 with a reference numeral 10. By applying the condition of the following equation (1) to the number of each diode group n1~n3, N2 and N3, the internal output voltage V3 can be expressed by the equation (2).

$$n1+(N2-n2)-(N3-n3)=0 \qquad (1)$$

$$V3=V_{SS1}+(V_{IN1}-V_{REF}) \qquad (2)$$

Here, when the level of the input signal voltage $V_{IN}$ applied to an input terminal 18 is equal to the reference signal voltage $V_{REF}$ applied to a reference input terminal 17, the internal output voltage V3 derived from an output node 16 becomes equal to the first source power supply voltage $V_{SS1}$ supplied to a first source power supply terminal 12. By connecting an internal logic circuit 9B to the above input logic level conversion circuit 10, which is a BFL circuit in which the gate width of the FET Q1b is set equal to that of the FET Q2a, it is made possible to achieve full compensation and adjustment on the matching error of input logic level, caused by the fluctuations in the first source power supply voltage $V_{SS1}$ and the temperature change, whereby the maximum operation speed is improved, the usable temperature range is enlarged and the tolerance range for the power supply voltages in the GaAs ICs is enlarged.

However, for the internal logic circuit in which the threshold value of the input logic is not equal to the first source power supply voltage $V_{SS1}$ such as the DCFL circuit shown in FIG. 1A and a more typical BFL circuit in which the gate width of the FET Q1b is not equal to that of the FET Q2a, even by the input logic level conversion circuit 10, the above mentioned compensation function is insufficient, and this has been a problem because the matching error caused by the power supply voltage fluctuations and the temperature dependency remains unadjustable.

Therefore, in order to realize a high integration density and a high-speed operation, in the input circuit of the GaAs IC which consists of the logic circuit of the single-ended type, it is necessary to have the function of compensation and adjustment so as to keep a sufficient level matching between the external logic level and the logic level of the internal logic circuit against the factors such as changes in the fluctuations of the source power supply voltage ($V_{SS1}$) and changes in the temperature or the changes in the device parameters, regardless of the types of internal logic circuits.

In the conventional semiconductor integrated circuit devices as explained above, however, there was no input circuit that has the aforementioned compensation and adjusting function for the combinations with all kinds of internal logic circuits, and there was no circuit to improve and increase resistance to the matching error.

SUMMARY OF THE INVENTION

It is, therefore, an object of the invention to overcome the problems existing in the conventional semiconductor integrated circuit device and to provide an improved semiconductor integrated circuit device having an input circuit, in which the level matching between the level of the external input signal and the logic level of the internal logic circuit against the changes in the power supply voltages and the temperature changes can be satisfactorily maintained for all kinds of internal logic circuits.

According to one aspect of the invention, there is provided a semiconductor integrated circuit device which comprises:

a drain power supply terminal, a first source power supply terminal and a second source power supply terminal;

an input logic level conversion circuit including a first to a third upper field effect transistor each having a drain connected to the drain power supply terminal and a source connected through at least one forwardly directed diode to each of first to third internal output nodes, the first upper field effect transistor having a gate receiving a standard voltage, the second upper field effect transistor having a gate receiving a reference input signal, and the third upper field effect transistor having a gate receiving an external input signal, and including a first to a third lower field effect transistor, the first lower field effect transistor having a drain connected to the first internal output node, a gate and a source connected together and further connected to the second source power supply terminal, the second lower field effect transistor having a drain connected to the second internal output node, a gate connected to the first internal output node, and a source connected through at least one forwardly directed diode to the second source power supply terminal, and the third lower field effect transistor having a drain connected to the third internal output node, a gate connected to the second internal output node, and a source connected through at least one forwardly directed diode to the second source power supply terminal, whereby an output voltage whose potential is the same as that of the standard voltage applied to the gate of the first upper field effect transistor is outputted from the third internal output node;

an internal logic circuit connected between the drain power supply terminal and the first source power supply terminal, receiving the output voltage from the input logic level conversion circuit and outputting an output signal at an output terminal; and a standard voltage generation circuit connected between the drain power supply terminal and the first source power supply terminal, outputting at a standard voltage output terminal the standard voltage to be supplied to the input logic level conversion circuit, having the same circuit configuration as that of the internal logic circuit, and including at least a driver field effect transistor, a load element and a negative feedback resistor which is connected between the standard voltage output terminal and a gate of the driver field effect transistor.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, some embodiments of the present invention will be explained with reference to the appended drawings. It should be noted that, throughout the following explanation, similar reference symbols or numerals refer to the same or similar elements in all the figures of the drawings.

Figure 3:
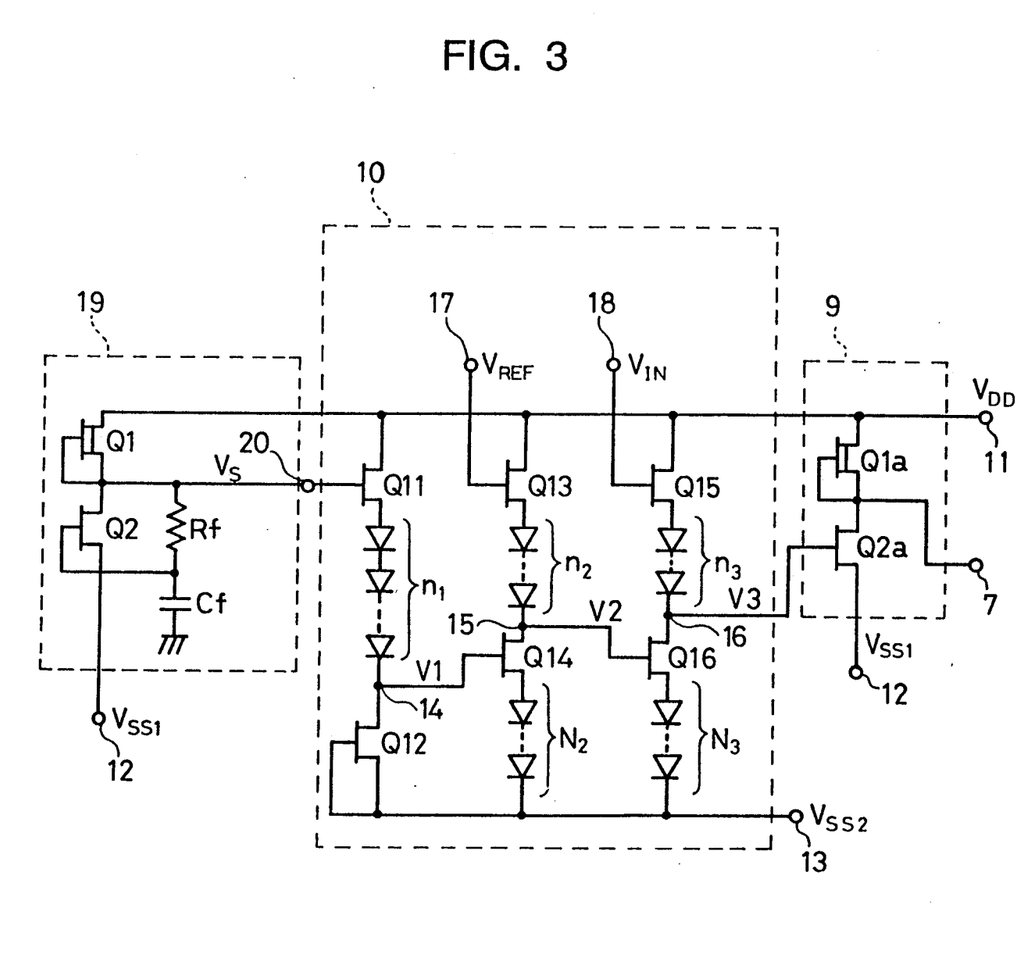
FIG. 3 is a circuit diagram showing a circuit of a first embodiment according to the present invention.

FIG. 3 diagrammatically shows the circuit of a first embodiment according to the invention. The input logic level conversion circuit 10 in this embodiment is provided with three stages of FET pairs, each stage comprising a pair of upper and lower field effect transistors Q11, Q12; Q13, Q14; and Q15, Q16. Each of the FET pairs has the same gate length and the same gate width, and is formed in the same active layer, so that the upper and lower FETs in each stage have the completely identical electrical characteristics. The input logic level conversion circuit 10 further includes a plurality of first to fifth diode groups n1~n3, N2 and N3, the first to third diode groups n1~n3 being respectively connected in the forward direction between the upper and lower FETs in each stage, and the fourth and fifth diode groups N2, N3 being connected in the forward direction between the lower FETs Q14, Q16 and the second source power supply terminal 13, respectively. The respective diodes in each of the first to fifth diode groups n1~n3, N2 and N3 have the same forward voltage $V_F$. Usually, since the active layer of the diode and the active layer of each FET are formed in the same fabricating process, the aforementioned pairing characteristics of the elements can readily be realized. Here, it should be noted that the number of diodes in each diode group is set to satisfy the condition given in the aforementioned equation (1).

Next, the operation of the circuit according to the present invention is explained. Here, each symbol denotes as follows. The symbol V1 represents a voltage of an internal output node 14; V2 a voltage of an internal output node 15; V3 a voltage of an internal output node 16 (an input voltage to the internal logic circuit); $V_{REF}$ a reference voltage signal; $V_{IN}$ an input voltage signal; $V_S$ a standard voltage. Also, the reverse (negative) direction in a potential difference under the state in which the drain power supply voltage $V_{DD}$ is set at the ground potential (0 V) is assumed as the forward direction. In this case, when all the FETs Q11, Q12, Q13, Q14, Q15 and Q16 are set to be always in their saturation states, the following equations (3)~(5) are satisfied, and the equation (6) can be obtained from the condition given in the aforementioned equation (1).

$$V1 = V_S + n1 V_F \quad (3)$$
$$V2 = V_{REF} + (V_{SS} - V1) - (N2 - n2)V_F \quad (4)$$
$$\quad (5)$$
$$V3 = V_{IN} - V_{REF} + (N2 - n2)V_F + V_1 - (N3 - n3)V_F$$
$$= V_S + (V_{IN} - V_{REF}) + [n1 + (N2 - n2) - (N3 - n3)]V_F$$
$$V3 = V_S + (V_{IN} - V_{REF}) \quad (6)$$

Here, in the case where the input signal $V_{IN}$ is at the logical threshold value of the internal logic circuit 9, the output voltage V3 at the node 16 becomes equal to the standard voltage $V_S$ applied to the terminal 20 because the input signal voltage $V_{IN}$ and the reference signal voltage $V_{REF}$ are identical.

As shown in the above equations, the output voltage V3 at the output node 16 which is inputted to the internal logic circuit 9 is equal to the standard voltage $V_S$ without being influenced by any other factors as long as all the FETs Q11~Q16 operate in their saturation states and show constant-current characteristics. Therefore, in the case where the standard voltage $V_S$ is at the same potential as the logical threshold value $VL_{TH}$ of the internal logic circuit, that is, $V_S = VL_{TH}$, it is possible to overcome at the same time the two problems in the conventional technology for all types of internal logic circuits. To be more specific, firstly, the input potential applied to the internal logic circuit is always equal to the threshold value of internal logic circuit and thus resistance against the power supply voltage fluctuations is improved. Secondly, resistance of the device parameters including the forward voltage of the diode against temperature changes and variations in manufacturing is improved.

Figure 4A:
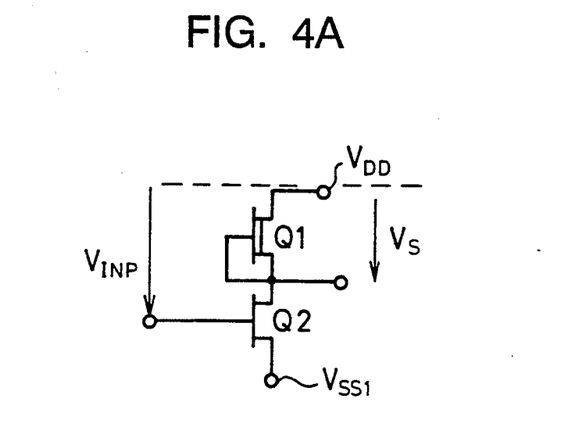
FIG. 4A is a circuit diagram showing a standard voltage generation circuit shown in FIG. 3.

A standard voltage generation circuit 19 for supplying the standard voltage $V_S$ to the standard voltage input terminal 20 of the input logic level conversion circuit 10 which is the same as the conventional one consists of a depletion mode FET Q1, an enhancement mode FET Q2, a series negative feedback resistor Rf and a parallel capacitor Cf. It should be noted that the FET Q1 and Q2 are so designed that they have the same element structure and characteristics as the load FET Q1a and the driving FET Q2a which form the internal logic circuit 9 (called DCFL circuit with E/D configuration). The gate electrode of the top stage FET Q2 is connected with the source electrode of FET Q1 through a feedback circuit consisting of the series negative feedback resistor Rf and the parallel capacitor Cf to prevent oscillation.

Figure 4B:
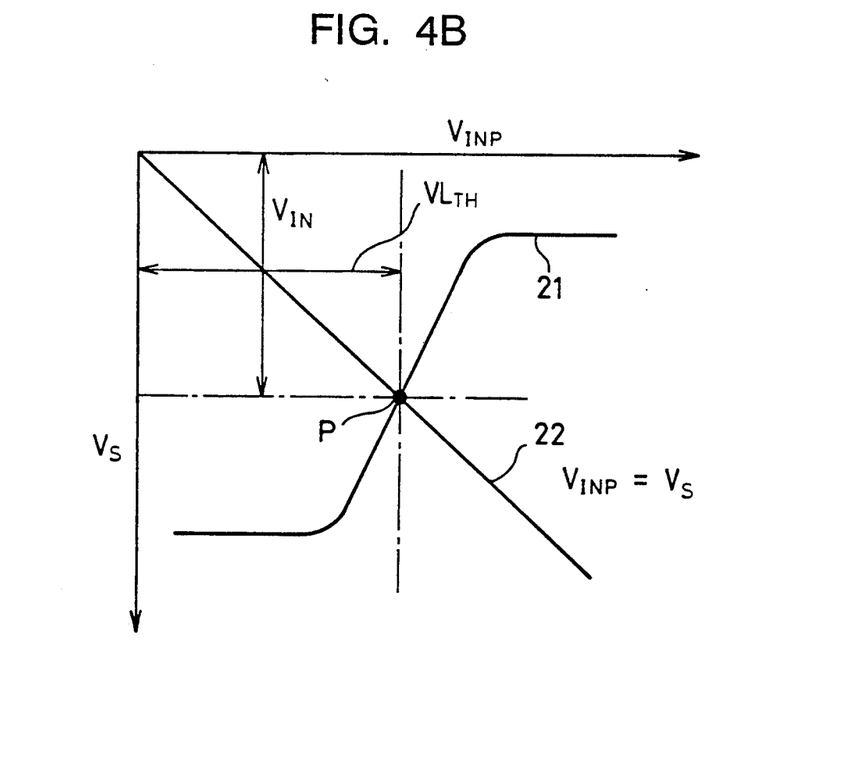
FIG. 4B is a graph showing input/output characteristics for explaining the operation of the standard voltage generation circuit shown in FIG. 4A.

In this case, the potential of output voltage $V_S$ at the standard voltage output terminal 20 is obtained from the operating point P shown in FIG. 4B. Because the FETs Q1, Q2 are designed to have the same characteristics with the FETs Q1a, Q2a, respectively, in the internal logic circuit 9, the output potential $V_S$ with respect to the operating point P is always equal to the logical threshold value $VL_{TH}$ of the internal logic circuit. Also, although the standard voltage generation circuit 19 includes the negative feedback circuit, it can stably generate the standard voltage $V_S$ without showing ring oscillation since gains in the high-frequency region are attenuated by the integrating circuit formed by the series negative feedback resistor Rf and the parallel capacitor Cf.

In this case, the standard voltage $V_S$ automatically becomes equal to the logical threshold value $VL_{TH}$ of the internal logic circuit regardless of the changes in the first source power supply voltage $V_{SS1}$ or in the device parameters. Therefore, as has already been explained with reference to FIG. 3, the level matching for the internal logic circuit 9 formed by the E/D configuration DCFL circuit in the semiconductor integrated circuit device can always be achieved sufficiently regardless of the power supply voltage fluctuations or the temperature changes.

Figure 5:
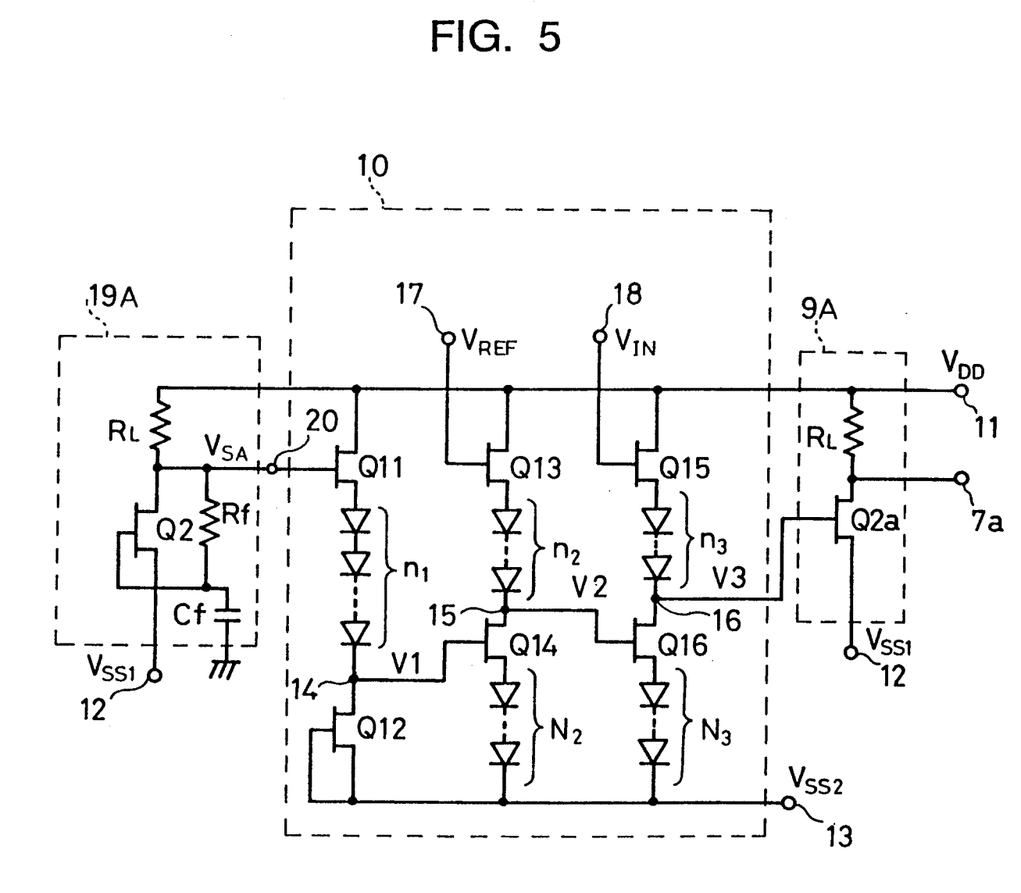
FIG. 5 is a circuit diagram showing a circuit of a second embodiment according to the present invention.

FIG. 5 is a circuit diagram showing a circuit of a second embodiment according to the invention. The standard voltage generation circuit 19A in this embodiment comprises a resistor $R_L$ and a first stage driving FET Q2 which are formed by the same fabricating process so that they have the same electrical characteristics with a resistor $R_L$ and a driving FET Q2a in the internal logic circuit 9A. The output terminal of the E/R configuration DCFL inverter consisting of the resistor $R_L$ and the FET Q2 is connected to the gate of the FET Q2 which is an inverter input by way of the feedback circuit formed by a series resistor Rf and a parallel capacitor Cf. Therefore, the standard output voltage $V_{SA}$ obtained at the output terminal in this case basically becomes equal to the logical threshold value $VL_{TH}$ of the internal logic circuit 9A of the E/R configuration DCFL as already explained in relation to the operation of the circuit shown in FIGS. 4A and 4B. Thus, according to this embodiment of the invention, the level matching for the internal logic circuit 9A formed by the E/R configuration DCFL circuit in the semiconductor integrated circuit device can always be achieved sufficiently regardless of the power supply voltage fluctuations or the temperature changes.

Figure 6:
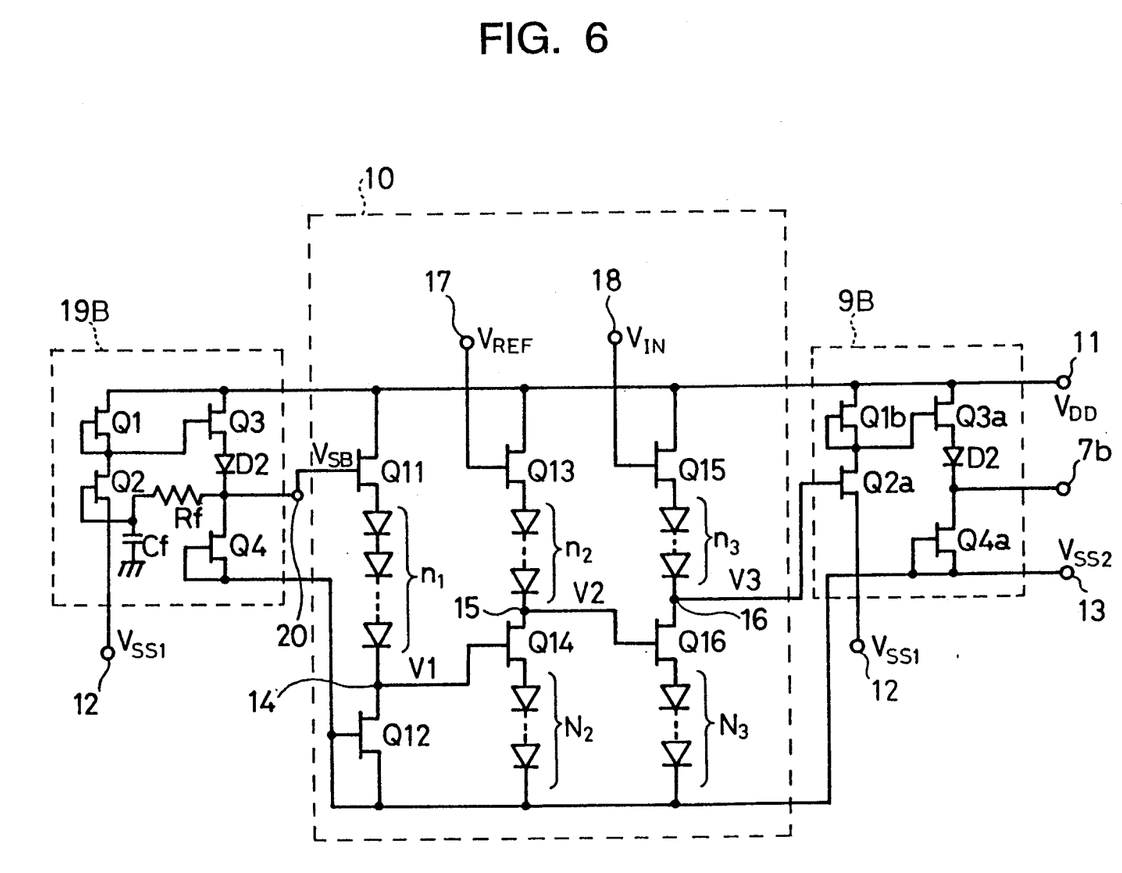
FIG. 6 is a circuit diagram showing a circuit of a third embodiment according to the present invention.

FIG. 6 is a circuit diagram showing a specific example of a circuit according to the invention, in which the internal logic circuit 9B is constituted by a BFL circuit. The standard voltage generation circuit 19B in this embodiment includes FETs Q1, Q2, Q3, Q4 and a diode D2. The FETs Q1, Q2, Q3, Q4 and the diode D2 in the standard voltage generation circuit 19B are formed by the same manufacturing process as that for the FETs Q1b, Q2a, Q3a, Q4a and the diode D2 in the internal logic circuit 9B, so that the electrical characteristics of the FETs Q1, Q2, Q3, Q4 and the diode D2 become the same as those of the FETs Q1b, Q2a, Q3a, Q4a and the diode D2. Consequently, the standard voltage generation circuit 19B formed by the FETs Q1~Q4 and the diode D2 functions as the BFL inverter that is the same as the BFL inverter constituting the internal logic circuit 9B, and the output terminal 20 thereof is connected to the gate of the first stage FET Q2 through a negative feedback circuit formed by a series resistor Rf and a parallel capacitor Cf.

The standard voltage $V_{SB}$ in this case also, as has already been explained in FIGS. 4A and 4B, becomes equal to the logical threshold value $VL_{TH}$ of the internal logic circuit 9B. Consequently, according to this embodiment, the level matching for the internal logic circuit 9B formed by the BFL circuit in the semiconductor integrated circuit device can always be achieved sufficiently regardless of the power supply voltage fluctuations or the temperature changes.

This invention can be applied to all types of internal logic circuits in the single-ended type. Also, the improvement in the margin of level matching makes it possible to further decrease the internal logical amplitude. Therefore, this invention is extremely advantageous in decreasing the power consumption and increasing the operation speed of the GaAs IC.

As has been explained hereinabove, the input level matching circuit according to this invention is formed by the FETs and the diode groups, which is provided with the function of compensating completely the variations of device parameters caused by the temperature changes by applying a specific restriction on the number of diodes in the respective diode groups, and by using the output of standard voltage generation circuit, that automatically generates the voltage corresponding to the internal logical threshold value, as one of the reference inputs in the input logic level conversion circuit.

As a result, first, the tolerable range for the fluctuations in the power supply voltages in the logical level matching between the external input signal level and the logical level of the internal logic circuit can be improved. Second, the influence of the device parameter fluctuations caused by temperature change, variations of manufacturing, etc. to the aforementioned level matching can be eliminated completely. Third, both of these improvements can be realized at the same time for all types of internal logic circuits.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor integrated circuit device comprising:
    a drain power supply terminal, a first source power supply terminal and a second source power supply terminal;
    an input logic level conversion circuit including first, second and third upper FETs each having a drain connected to said drain power supply terminal and a source connected through at least one forwardly directed diode to each of first, second and third internal output nodes, said first upper FET having a gate receiving a standard voltage, said second upper FET having a gate receiving a reference input signal, and said third upper FET having a gate receiving an external input signal, and including first, second and third lower FETs, said first lower FET having a drain connected to said first internal output node, a gate and a source commonly connected to said second source power supply terminal, said second lower FET having a drain connected to said second internal output node, a gate connected to said first internal output node, and a source connected through at least one forwardly directed diode to said second source power supply terminal, and said third lower FET having a drain connected to said third internal output node, a gate connected to said second internal output node, and a source connected through at least one forwardly directed diode to said second source power supply terminal, whereby an output voltage whose potential is the same as that of said standard voltage applied to the gate of said first upper FET is outputted from said third internal output node;
    an internal logic circuit which is formed between said drain power supply terminal and said first source power supply terminal, and which receives said output voltage from said input logic level conversion circuit and outputs an output signal at an output terminal, said internal logic circuit including at least a first driver FET and a first load element; and
    a standard voltage generation circuit which is formed between said drain power supply terminal and said first source power supply terminal, and which is for outputting at a standard voltage output terminal said standard voltage to be supplied to said input logic level conversion circuit, said standard voltage generation circuit having at least a second driver FET and a second load element which have the same element structure and characteristics as those of said first driver FET and said first load element in said internal logic circuit, and a negative feedback resistor (Rf) which is connected between said standard voltage output terminal and a gate of said second driver FET.

2. A semiconductor integrated circuit device according to claim 1, in which:
    said internal logic circuit has a first enhancement mode FET as said first driver FET having a gate connected to said third internal output node of said input logic level conversion circuit and a source connected to said first source power supply terminal and a drain connected to said output terminal, and a first depletion mode FET as said first load element having a drain connected to said drain power supply terminal and a gate and a source commonly connected to said output terminal, thereby forming an E/D type inverter circuit; and
    said standard voltage generation circuit has a second enhancement mode FET as said second driver FET having a drain connected to said standard voltage output terminal, and a source connected to said first source power supply terminal, and a second depletion mode FET as said second load element having a drain connected to said drain power supply terminal and a gate and a source commonly connected to said standard voltage output terminal.

3. A semiconductor integrated circuit device according to claim 2, further comprising a parallel capacitor having one end connected to the gate of said second enhancement mode FET and the other end connected to a ground.

4. A semiconductor integrated circuit device according to claim 1, in which:

said internal logic circuit has a first FET as said first driver FET having a gate connected to said third internal output node of said input logic level conversion circuit and a source connected to said first source power supply terminal and a drain connected to said output terminal, and a first resistor as said first load element connected between said drain power supply terminal and said output terminal, thereby forming an E/R type inverter circuit; and said standard voltage generation circuit has a second FET as said second driver FET having a drain connected to said standard voltage output terminal, and a source connected to said first source power supply terminal, and a resistor as said second load element connected between said drain power supply terminal and said standard voltage output terminal.

5. A semiconductor integrated circuit device according to claim 4, further comprising a parallel capacitor having one end connected to the gate of said second FET and the other end connected to a ground.

6. A semiconductor integrated circuit device according to claim 1, in which:

said internal logic circuit has a first FET as said first driver FET having a gate connected to said third internal output node of said input logic level conversion circuit, a source connected to said first source power supply terminal; a second FET as said first load element having a drain connected to said drain power supply terminal and a gate and a source commonly connected to a drain of said first FET; a third FET having a gate connected to a junction between said first and second FETs, and a drain connected to said drain power supply terminal; a fourth FET having a gate and a source commonly connected to said second source power supply terminal, and a drain connected to said output terminal, and at least one first diode connected in series and in a forward direction between a source of said third FET and the drain of said fourth FET thereby forming a BFL type inverter circuit; and said standard voltage generation circuit has a fifth FET as said second driver FET having a source connected to said first source power supply terminal; a sixth FET as said second load element having a drain connected to said drain power supply terminal, and a gate and a source commonly connected to a drain of said fifth FET; a seventh FET having a drain connected to said drain power supply terminal and a gate connected to a junction between said fifth and sixth FETs; an eight FET having a gate and a source commonly connected to said second source power supply terminal, and a drain connected to said standard voltage output terminal and at least one second diode connected in series and in a forward direction between a source of said seventh FET and the drain of said eighth FET.

7. A semiconductor integrated circuit device according to claim 6, in which each of said first to fourth FETs and said first diode in said internal logic circuit has correspondingly the same element structure and characteristics as those of each of said fifth to eighth FETs and said second diode in said standard voltage generation circuit.

8. A semiconductor integrated circuit device according to claim 6, further comprising a parallel capacitor having one end connected to the gate of said fifth FET and the other end connected to a ground.

* * * * *